US008780068B2

(12) United States Patent
Lin

(10) Patent No.: US 8,780,068 B2
(45) Date of Patent: *Jul. 15, 2014

(54) CAPACITIVE TOUCH SENSING AND LIGHT EMITTING DIODE DRIVE MATRIX

(71) Applicant: Microchip Technology Incorporated, Chandler, AZ (US)

(72) Inventor: Chien-Yi Lin, Taipei (TW)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/866,700

(22) Filed: Apr. 19, 2013

(65) Prior Publication Data

US 2013/0229385 A1  Sep. 5, 2013

Related U.S. Application Data

(63) Continuation of application No. 12/642,089, filed on Dec. 18, 2009, now Pat. No. 8,427,450.

(60) Provisional application No. 61/143,845, filed on Jan. 12, 2009.

(51) Int. Cl.
*G06F 3/041* (2006.01)

(52) U.S. Cl.
USPC .............................. 345/173; 345/179; 345/174

(58) Field of Classification Search
USPC ................................................. 345/173–179
See application file for complete search history.

(56) References Cited

U.S. PATENT DOCUMENTS

| 5,973,417 A | 10/1999 | Goetz et al. ................... 307/129 |
| 6,452,514 B1 | 9/2002 | Philipp ............................ 341/33 |
| 8,427,450 B2 | 4/2013 | Lin ................................ 345/174 |
| 2008/0158174 A1 | 7/2008 | Land et al. .................... 345/173 |

(Continued)

FOREIGN PATENT DOCUMENTS

| EP | 1589407 A1 | 10/2005 | ............... G06F 3/02 |
| EP | 1876711 A1 | 1/2008 | ............. H03K 17/96 |
| EP | 1936807 A1 | 6/2008 | ............. H03K 17/96 |
| WO | 2008/005505 A2 | 1/2008 | ............. G06F 3/044 |

OTHER PUBLICATIONS

European Decision to Refuse, Application No. 10700292, 11 pages, May 16, 2013.

(Continued)

*Primary Examiner* — Van Chow
(74) *Attorney, Agent, or Firm* — King & Spalding L.L.P.

(57) ABSTRACT

A pulse is applied through a capacitive touch key sensor to a sampling capacitor of an analog-to-digital converter (ADC). The voltage charge arriving at the sampling capacitor will be maximum when there is substantially no shunt capacitance between the capacitive touch key sensor and the sampling capacitor. However, a object such as an operator's finger when in close proximity to the capacitive touch key sensor will create a shunt to ground capacitance that diverts some of the charge that is supposed to go to the sampling capacitor and thereby reducing the voltage charge on the sampling capacitor. This change in charge voltage when the capacitive touch key sensor is activated (touched) may be easily detected with the ADC. In addition, light emitting diode (LED) displays may be integrated with the capacitive touch key sensors and use the same connections on an integrated circuit device in a time division multiplexed manor.

14 Claims, 4 Drawing Sheets

(56) References Cited

U.S. PATENT DOCUMENTS

| | | | |
|---|---|---|---|
| 2008/0251299 A1 | 10/2008 | Liao et al. | 178/18.06 |
| 2008/0277171 A1 | 11/2008 | Wright | 178/18.06 |
| 2011/0157077 A1* | 6/2011 | Martin et al. | 345/174 |

OTHER PUBLICATIONS

Chinese Office Action, Application No. 201080004445.7, 10 pages, Apr. 28, 2013.

* cited by examiner

CAPACITIVE TOUCH SENSING AND LIGHT EMITTING DIODE DRIVE MATRIX

RELATED PATENT APPLICATION

This application is a continuation of U.S. patent application Ser. No. 12/642,089 filed on Dec. 18, 2009, now U.S. Pat. No. 8,427,450 issued on Apr. 23, 2013, which claims priority to commonly owned U.S. Provisional Patent Application No. 61/143,845; filed Jan. 12, 2009; the contents of which are hereby incorporated by reference in their entirety.

TECHNICAL FIELD

The present disclosure relates to sensing capacitive touch keys and driving light emitting diodes (LEDs). The capacitive touch keys and LEDs may be arranged in a matrix and used as an information display and control panel for many different types of appliances, electrical and electronic equipment, etc.

BACKGROUND

An industry standard for capacitive touch key sensing electronics is the Microchip Technology Inc., Charge Time Measurement Unit (CTMU) incorporated into various microcontrollers manufactured by Microchip Technology Inc. See "Microchip CTMU for Capacitive Touch Applications, Microchip application note AN1250 (2009), hereby incorporated by reference herein for all purposes. The capacitive touch keys are used to detect the presence of a finger or other object that increases the capacitance of the touch key when brought in close proximity thereto, e.g., touching the key with the finger or object. The CTMU requires a constant current source, uses power and takes up valuable integrated circuit chip real estate.

The CTMU senses a change in capacitance of a touch key by charging the effective capacitance with a constant current source and then measuring the voltage thereon after a certain time period. A larger capacitance being charged during the certain time period results in a lower voltage thereon then a smaller capacitance being charged under the same constant current charging and the certain time period. The CTMU samples the respective voltages on each one of the capacitive touch keys in the control matrix and when a lower voltage is detected then what would normally be on an untouched key, the CTMU and associated software detect the actuation of that key.

However, many factors influence the capacitance of the touch key when untouched and/or touched such as moisture, e.g., humidity or water, on the touch key. When only certain ones of the touch key matrix have moisture on them, the capacitances thereof my be different enough to cause false sensing by the CTMU of those keys having higher capacitance induced by the moisture.

In many applications for control and display, LEDs associated with each of the capacitive touch keys are also desirable. However, the LEDs must be driven and thereby require additional connections besides those required for the touch keys. It is possible to multiplex sensing and drive operations and thereby use common connections for the LEDs and touch key circuits, but the LED portion tends to degrade the operation of the touch key when both are coupled together.

A prior technology capacitive touch sensor matrix circuit uses an additional capacitor and resistor per touch key, and requires a dual slope detection algorithm and timer capture to perform a single touch detection. Thus requiring circuit complexity and significant time to detect a touch key capacitive change.

SUMMARY

What is needed is better immunity to humid/wet environments, low cost of implementation, shorter capacitive change detection time (touch sense), and improved operation when using time division multiplexing of commonly connected (minimum number of integrated circuit device connections (pins) required) capacitive touch keys and LED displays.

According to a specific example embodiment of this disclosure, a system for sensing actuation of a capacitive touch sensor comprises: a sampling capacitor: an analog-to-digital converter (ADC) coupled to the sampling capacitor, the ADC converting an analog voltage on the sampling capacitor to a digital representation thereof; a digital processor coupled to a digital output of the ADC; a capacitive touch sensor coupled to the sampling capacitor; a pulse generator coupled to the capacitive touch sensor, wherein a voltage pulse from the pulse generator and through the capacitive touch sensor charges the sampling capacitor to a first voltage in proportion to a capacitance ratio thereof, wherein when an object having a capacitance is in close proximity to the capacitive touch sensor some of the voltage pulse through the capacitive touch sensor is diverted from the sampling capacitor, and whereby the sampling capacitor is charged to a second voltage when the object is in close proximity to the capacitive touch sensor, were the second voltage is less than the first voltage.

According to another specific example embodiment of this disclosure, a system for sensing actuation of one or more of a plurality of capacitive touch sensors, said system comprising: a sampling capacitor: an analog-to-digital converter (ADC) coupled to the sampling capacitor, the ADC converting an analog voltage on the sampling capacitor to a digital representation thereof; a digital processor coupled to a digital output of the ADC; a multiplexer having an output coupled to the sampling capacitor; a plurality of capacitive touch sensors, each of the plurality of capacitive touch sensors is coupled to a respective input of the multiplexer; a pulse generator coupled to selected ones of the plurality of capacitive touch sensors, wherein a voltage pulse from the pulse generator and through the selected one of the plurality of capacitive touch sensors charges the sampling capacitor to a first voltage in proportion to a capacitance ratio thereof, wherein when an object having a capacitance is in close proximity to the selected one of the plurality of capacitive touch sensors some of the voltage pulse therethrough is diverted from the selected one of the plurality of capacitive touch sensors, and whereby the sampling capacitor is charged to a second voltage when the object is in close proximity to the selected one of the plurality of capacitive touch sensors, were the second voltage is less than the first voltage.

According to yet another specific example embodiment of this disclosure, a method for sensing actuation of any one of a plurality of capacitive touch sensors, said method comprising the steps of: setting to a logic low all integrated circuit device input-outputs (I/Os) coupled to a plurality of capacitive touch sensors; setting a one of the I/Os to an input mode and all of the other I/Os to logic high outputs; charging a sampling capacitor coupled to the I/O in the input mode; converting to a digital representation an analog voltage charged on the sampling capacitor with an analog-to-digital converter (ADC); determining whether the digital representation is above or below a threshold value, wherein if less than the threshold value then the one of the plurality of capacitive touch sensors associated with the I/O in the input mode is actuated; and repeating the above steps for each of the plurality of capacitive touch sensors.

BRIEF DESCRIPTION OF THE DRAWINGS

A more complete understanding of the present disclosure thereof may be acquired by referring to the following description taken in conjunction with the accompanying drawings wherein.

Figure 1:
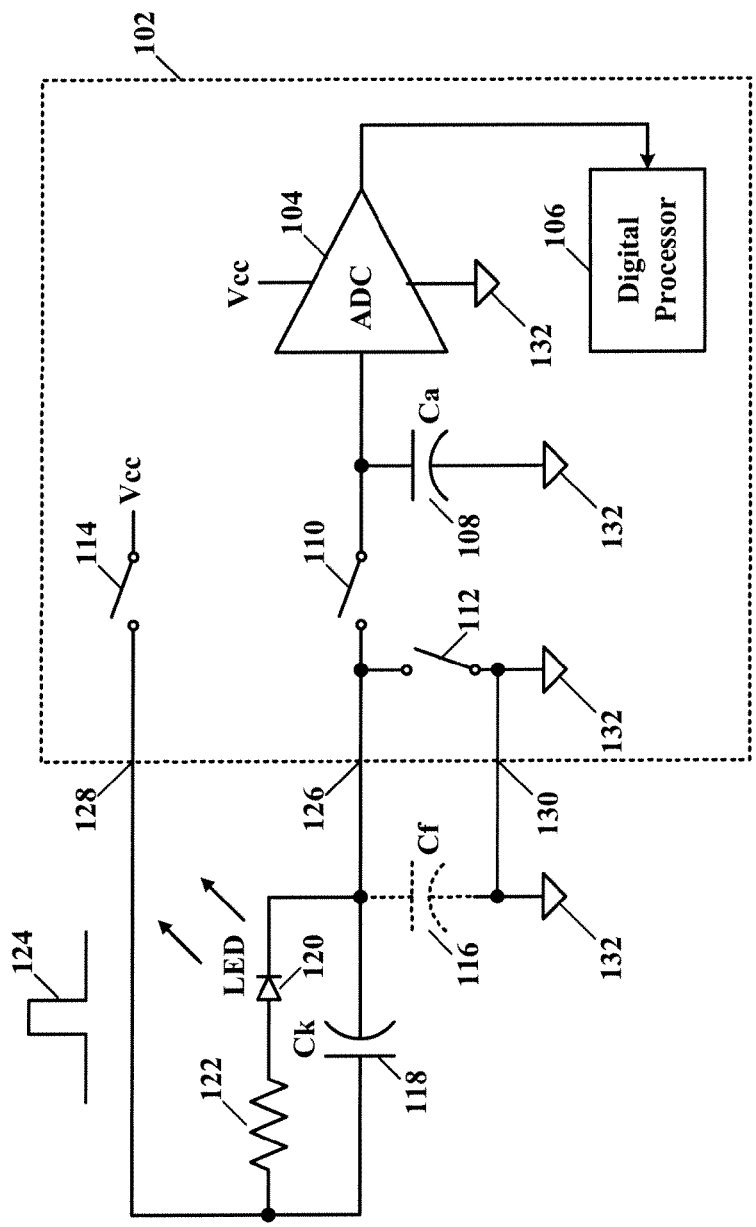
FIG. 1 illustrates a schematic diagram of a capacitive touch sensor key actuation detection and LED display circuit, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic diagram of a capacitive touch sensor key actuation detection and LED display circuit, according to a specific example embodiment of this disclosure. An integrated circuit device 102 comprises an analog-to-digital converter (ADC) 104, a digital processor 106 having a memory (not shown), a sampling capacitor 108 that may be part of the ADC 104, and switches 110, 112 and 114. Switch 110 may be part of an internal multiplexer, etc. Switches 112 and 114 may be output drives, e.g., totem-pole connected CMOS, open collector NMOS, etc. A single capacitive touch sensor key 118 and LED display 120 are shown for illustrative purposes. As will be described herein, a plurality of capacitive touch sensor keys 118 and LEDs 120 may be configured as a control and display panel. The integrated circuit device 102 may be a mixed signal microcontroller, e.g., having both analog and digital circuits.

A pulse 124 from switch 114 is applied to the capacitive touch sensor key 118 (capacitor Ck) and the resulting voltage pulse passing through the capacitance of the capacitive touch sensor key 118 to charge the sampling capacitor 108 (capacitor Ca). The voltage charge on the sampling capacitor 108 will be the voltage division resulting from the capacitance ratio of the capacitive touch sensor key 118 and the sampling capacitor 108. The resulting voltage charge on the sampling capacitor 108 is measured by the ADC 104.

When a finger actuates (e.g., comes in physical contact, touches, etc.) the capacitive touch sensor key 118, a shunt capacitance 116 (Cf) to ground is created that decreases the amplitude of the voltage pulse reaching the sampling capacitor 108 and being measured by the ADC 104. When the voltage charge measured on the sampling capacitor 108 is less than a previously measured voltage charge and/or a base reference voltage charge, then it is assumed that a finger, or other object that has capacitance to ground or common, has actuated the capacitive touch sensor key 118.

An advantage of the embodiment shown in FIG. 1 is that moisture does not substantially affect this capacitive touch sensor key actuation detection circuit because moisture may increase the capacitive value Ck of the capacitive touch sensor key 118, thus resulting in a larger voltage charge on the sampling capacitor 108 that is easily measured by the ADC 104. The embodiment shown in FIG. 1 reduces cost and enables faster detection times because no additional electronic components are required. Also the touch detection may be performed within a single low-to-high voltage step, e.g., rising edge of pulse 124, and thus no time consuming current integration is necessary as is required in a CTMU capacitive touch detection circuit.

Control of an LED display 120 may also be easily implemented without requiring addition connections (pins) to the integrated circuit device 102. When it is desired to turn on the LED display 120, switches 112 and 114 are both closed. This completes a circuit for current to flow through the LED display 120 that is limited by the current limiting resistor 122. A current controlled voltage source may also be used, thus eliminating the requirement for the current limiting resistor 122. Therefore, connections (pins) 126 and 128 may be used in a time division multiplexed manor for both detection of the actuation of the capacitive touch sensor key 118 and control of the LED display 120.

Figure 2:
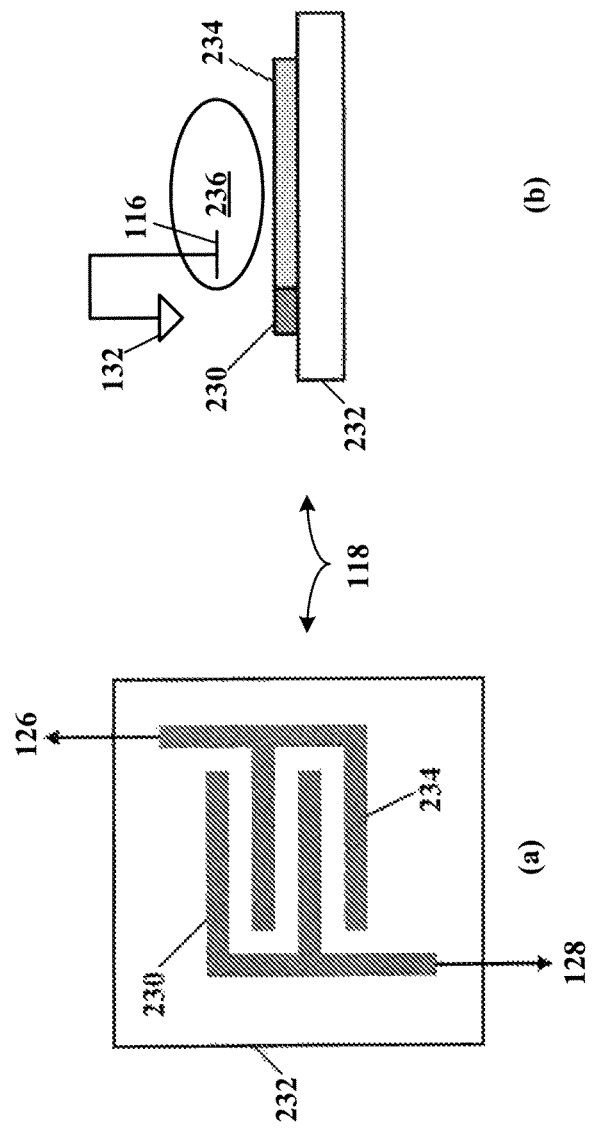
FIG. 2 illustrates schematic diagrams of plan and elevational views of a capacitive touch sensor key, according to a specific example embodiment of this disclosure.

Referring to FIG. 2, depicted are schematic diagrams of plan and elevational views of a capacitive touch sensor key, according to a specific example embodiment of this disclosure. A capacitive touch sensor key 118 comprises capacitor plates 230 and 234 on a face of an insulated substrate 232. The capacitor plates 230 and 234 are coupled to connections (pins) 128 and 126, respectively. When a finger 236 comes in close proximity to the capacitor plates 230 and 234, the inherent capacitance (capacitor 116 of FIG. 1) of the finger 236 will shunt some of the voltage charge passing through the capacitive touch sensor key 118 on the way to the sampling capacitor 108. In other words, the finger shunt capacitor 116 diverts some of the voltage charge intended for the sampling capacitor 108, thereby reducing the resulting voltage charge measured by the ADC 104.

Figure 3:
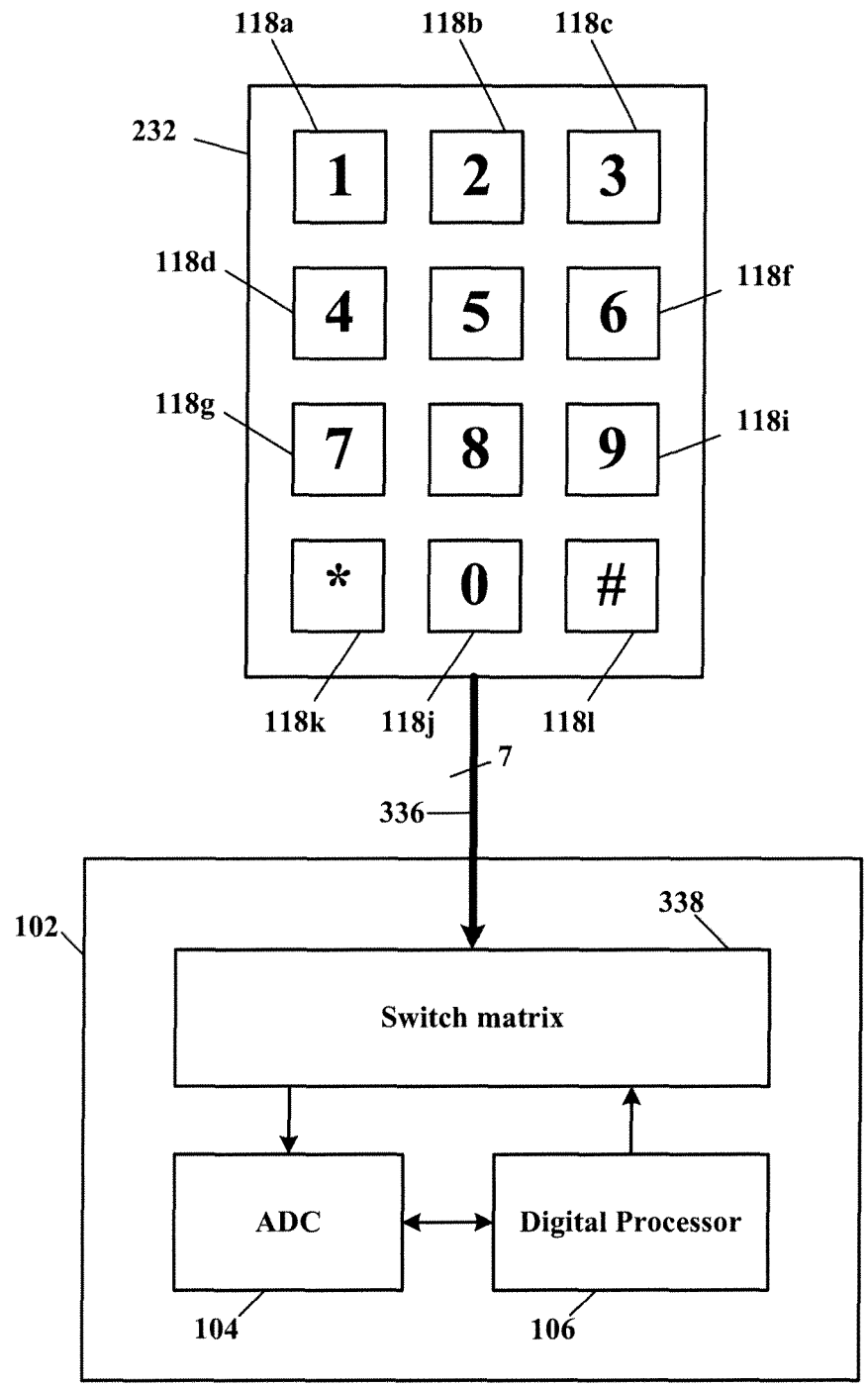
FIG. 3 illustrates a schematic block diagram of a matrix of capacitive touch keys and LEDs, according to another specific example embodiment of this disclosure.
Figure 4:
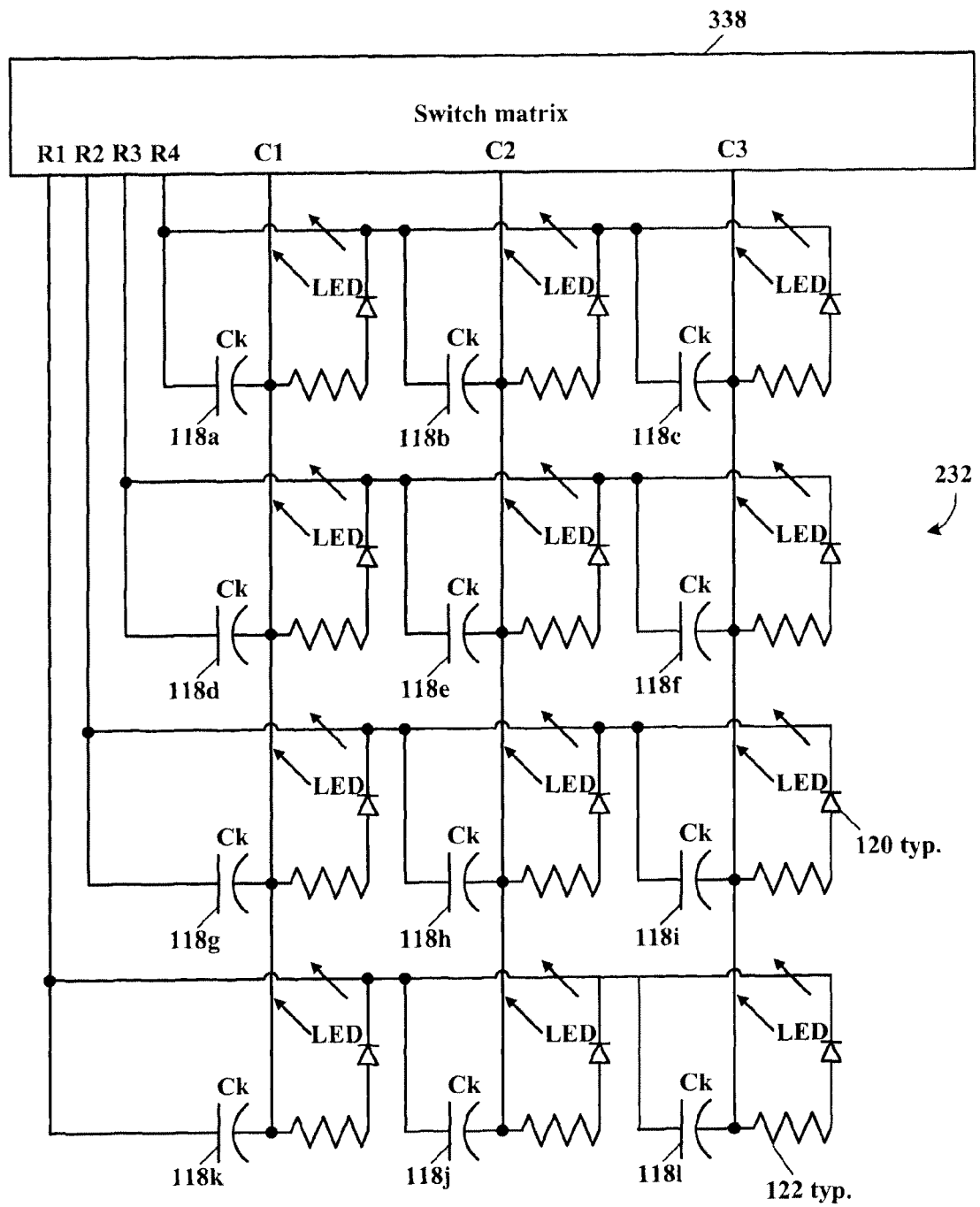
FIG. 4 illustrates a more detailed schematic diagram of the matrix of capacitive touch keys and LEDs shown in FIG. 3.

Referring to FIGS. 3 and 4, depicted in FIG. 3 is a schematic block diagram of a matrix of capacitive touch keys and LEDs, and depicted in FIG. 4 is a more detailed schematic diagram of the matrix of capacitive touch keys and LEDs shown in FIG. 3, according to a specific example embodiment of this disclosure. The capacitive touch keys 118 may be sensed and the LEDs 120 (shown in FIG. 4) driven over common connections (same device pins) by time division multiplexing of the sensing and driving operations for each of the keys 118 and LEDs 120, in combination with the switch matrix 338 of the integrated circuit device 102. An advantage of the circuits disclosed in FIGS. 1-4 is when the low-to-high step signal (pulse 124) is sent, the impedance of capacitive touch key 118 (capacitor Ck) is very low (small), compared to the impedance of the series connected resistor 122 and the LED 120. Therefore, the existence of the resistor 122 and the LED 120 can be ignored at the moment of key actuation detection. The switch matrix 338 may be, for example but not limited to, a multiplexer.

After the key actuation detection operation is finished, to turn on an LED 120, a column connected to the LED is set high and a row connection to the LED is set low. By alternating in time (time division multiplexing) the touch sense and LED drive operations, the very same connections (126 and 128) to the integrated circuit device 102 may be utilized. Thus, a three by four matrix panel will only require seven (7) connections (e.g., bus 336), a four by five matrix will only require nine (9) connections, etc., to the integrated circuit device 102 for both sensing and LED display driving of a control and display panel, according to the teachings of this disclosure.

For example:
1) Set columns C1-C3 and rows R1-R4 to logic low,
2) set rows R1-R4 to the input mode with the ADC function enabled,
3) set columns C1-C3 to logic high,
4) if row Rx (x=1, 2, 3 or 4) gets a lower ADC input voltage value than the other rows, then row Rx is touched,
5) set columns C1-C3 and rows R1-R4 to logic low,
6) set columns C1-C3 to the input mode with the ADC function enabled,
7) set rows R1-R4 to logic high, and
8) if column Cx (x=1, 2 or 3) gets a lower ADC input voltage value than the other columns, then column Cx is touched.
9) Combining steps 4) and 8), wherein the intersection of the row Rx and the column Cx having the lower ADC input voltage values determines which key was touched.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for sensing actuation of a capacitive touch sensor and indicating such actuation, in a system comprising:
a sampling capacitor having a first terminal connected to a reference potential and a second terminal;
an analog-to-digital converter (ADC) connected to the second terminal of the sampling capacitor;
a capacitive touch sensor having a first terminal connected to the sampling capacitor through a sampling switch and through a port switch with the reference potential and having a second terminal; and
a light emitting diode (LED) coupled in parallel with the capacitive touch sensor;
wherein the capacitive touch sensor and the LED use common connections;
wherein the method comprises:
generating a single voltage pulse and charging through the capacitive touch sensor the sampling capacitor to a first voltage in proportion to a capacitance ratio thereof, wherein when an object having a capacitance is in close proximity to the capacitive touch sensor some of the voltage pulse through the capacitive touch sensor is diverted from the sampling capacitor, and wherein the sampling capacitor is charged to a second voltage when the object is in close proximity to the capacitive touch sensor, wherein the second voltage is less than the first voltage, and
determining said voltage on said sampling capacitor; and
controlling the port switch and a voltage at said second terminal of the capacitive touch sensor to turn on said LED.

2. The method according to claim 1, wherein the system further comprises:
a multiplexer;
a plurality of capacitive touch sensors arranged in a matrix of C columns and R rows, wherein each capacitive touch sensor having a first terminal coupled to the sampling capacitor through said multiplexer and through respective port switches with the reference potential and a second terminal; and
a plurality of light emitting diodes (LED) each coupled in parallel with one of the capacitive touch sensors;
wherein each combination of capacitive touch sensor and LED use common connections;
wherein the method further comprises:
setting row and column connections of said matrix to logic low,
set ports connected to the rows to an analog input mode;
setting column connections of said matrix to logic high, determining and storing whether a row is at a lower voltage than other rows to determine which row has been touched,
setting the row and column connections to logic low,
set ports connected to the columns to an analog input mode;
setting the row connections to logic high, and determining and storing whether a column is at a lower voltage than other columns to determine which column has been touched;
combining the results to determine which capacitive touch sensor has been touched; and
controlling said multiplexer, port switches and a voltage at said second terminal of a respective capacitive touch sensor using time division multiplexing to turn on said associated LED.

3. The method according to claim 1, wherein a plurality of capacitive touch sensors are arranged in Cx columns and Ry rows, said method comprising the steps of:
connecting each Cx column and Ry row to a port of a microcontroller;
setting Cx columns and Ry rows to a logic low;
setting the Ry rows to an input mode for determining analog voltage values of the Ry rows by said microcontroller;
setting the Cx columns to a logic high;
scanning the Ry rows to determine which one of the Ry rows is at a lower analog voltage value than the other Ry rows;
setting the Cx columns and the Ry rows to a logic low;
setting the Cx columns to the input mode for determining analog voltage values of the Cx columns;
setting the Ry rows to a logic high;
scanning the Cx columns to determine which one of the Cx columns is at a lower analog voltage value than the other Cx columns; and
determining from an intersection of the Cx column and the Ry row having the lower analog voltage values which one of the plurality of capacitive touch sensors was touched.

4. The method according to claim 3, wherein the steps of determining the analog voltage values of the Cx columns and Ry rows are done with an analog-to-digital converter (ADC) of said microcontroller.

5. A system for sensing actuation of a capacitive touch sensor and indicating such actuation, comprising:
- a sampling capacitor having a first terminal connected to a reference potential and a second terminal:
- an analog-to-digital converter (ADC) connected to the second terminal of the sampling capacitor;
- a capacitive touch sensor having a first terminal connected to the sampling capacitor through a sampling switch and through a port switch with the reference potential and having a second terminal; and
- a light emitting diode (LED) coupled in parallel with the capacitive touch sensor;
- wherein the capacitive touch sensor and the LED use common connections;
- and a digital processor configured
- to generate a single voltage pulse and to charge through the capacitive touch sensor the sampling capacitor to a first voltage in proportion to a capacitance ratio thereof, wherein when an object having a capacitance is in close proximity to the capacitive touch sensor some of the voltage pulse through the capacitive touch sensor is diverted from the sampling capacitor, and wherein the sampling capacitor is charged to a second voltage when the object is in close proximity to the capacitive touch sensor, wherein the second voltage is less than the first voltage, and
- to determine said voltage on said sampling capacitor through said ADC; and
- to control the port switch and a voltage at said second terminal of the capacitive touch sensor to turn on said LED.

6. The system according to claim 5, wherein a plurality of capacitive touch sensors are arranged in Cx columns and Ry rows, and said digital processor is further operable:
- to connect each Cx column and Ry row to a port;
- to set Cx columns and Ry rows to a logic low;
- to set the Ry rows to an input mode for determining analog voltage values of the Ry rows;
- to set the Cx columns to a logic high;
- to scan the Ry rows to determine which one of the Ry rows is at a lower analog voltage value than the other Ry rows;
- to set the Cx columns and the Ry rows to a logic low;
- to set the Cx columns to the input mode for determining analog voltage values of the Cx columns;
- to set the Ry rows to a logic high;
- to scan the Cx columns to determine which one of the Cx columns is at a lower analog voltage value than the other Cx columns; and
- to determine from an intersection of the Cx column and the Ry row having the lower analog voltage values which one of the plurality of capacitive touch sensors was touched.

7. The system according to claim 6, wherein the digital processor controls the analog-to-digital converter (ADC) to determine the analog voltage values of the Cx columns and Ry rows.

8. The system according to claim 5, wherein the system further comprises:
- a multiplexer;
- a plurality of capacitive touch sensors arranged in a matrix of C columns and R rows, wherein each capacitive touch sensor having a first terminal coupled to the sampling capacitor through said multiplexer and through respective port switches with the reference potential and a second terminal; and
- a plurality of light emitting diodes (LED) each coupled in parallel with one of the capacitive touch sensors;
- wherein each combination of capacitive touch sensor and LED use common connections;
- wherein the digital processor is further configured:
  - to set row and column connections of said matrix to logic low,
  - to set ports connected to the rows to an analog input mode;
  - to set column connections of said matrix to logic high,
    - to determine and store whether a row is at a lower voltage than other rows to determine which row has been touched,
  - to set the row and column connections to logic low,
  - to set ports connected to the columns to an analog input mode;
  - to set the row connections to logic high, and
    - to determine and store whether a column is at a lower voltage than other columns to determine which column has been touched;
    - to combine the results to determine which capacitive touch sensor has been touched; and
    - to control said multiplexer, port switches and a voltage at said second terminal of a respective capacitive touch sensor using time division multiplexing to turn on said associated LED.

9. A system for sensing actuation of one or more of a plurality of capacitive touch sensors, said system comprising:
- a sampling capacitor having a first terminal connected to a reference potential and a second terminal:
- an analog-to-digital converter (ADC) connected to the second terminal of the sampling capacitor, the ADC converting an analog voltage on the sampling capacitor to a digital representation thereof;
- a digital processor coupled to a digital output of the ADC;
- a capacitive touch sensor and a light emitting diode (LED) coupled in parallel with the capacitive touch sensor, wherein the capacitive touch sensor has a first terminal connected to the sampling capacitor through a sampling switch and through a port switch with the reference potential and having a second terminal,
- a pulse generator controlled by said digital processor, wherein the digital processor is configured to control the pulse generator to feed a voltage pulse through the capacitive touch sensor to charge the sampling capacitor to a first voltage in proportion to a capacitance ration thereof, wherein when an object is in close proximity to the capacitive touch sensor some of the voltage pulse through the capacitive touch sensor is diverted from the sampling capacitor, and whereby the sampling capacitor is charged to a second voltage when the object is in close proximity to the capacitive touch sensor, wherein the second voltage is less than the first voltage; and
- wherein the digital processor is operable to control the port switch and a voltage at said second terminal of the capacitive touch sensor to turn on said LED.

10. The system according to claim 9, wherein the object is a finger.

11. The system according to claim 9, wherein the digital processor stores in a memory thereof digital representations of voltages from the ADC for said capacitive touch sensor, wherein when a digital representation of a voltage sampled by the ADC is less then a respective one of the stored voltage representations in memory, a signal is generated indicating that the capacitive touch sensors was actuated.

12. The system according to claim 9, wherein the voltage on the sampling capacitor is sampled by the ADC and the LED is turned on during alternate time periods.

13. The system according to claim 9, wherein the sampling capacitor, ADC, I/O ports, and digital processor are fabricated in an integrated circuit device.

14. The system according to claim 13, wherein the integrated circuit device is a mixed signal microcontroller.

* * * * *